(12) United States Patent
Miyajima

(10) Patent No.: US 12,386,248 B2
(45) Date of Patent: Aug. 12, 2025

(54) METHOD OF CONTROLLING DISPLAY DEVICE AND DISPLAY DEVICE

(71) Applicant: SEIKO EPSON CORPORATION, Tokyo (JP)

(72) Inventor: Tomonori Miyajima, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 109 days.

(21) Appl. No.: 18/192,856

(22) Filed: Mar. 30, 2023

(65) Prior Publication Data
US 2023/0314919 A1    Oct. 5, 2023

(30) Foreign Application Priority Data
Mar. 30, 2022  (JP) ................................ 2022-055315

(51) Int. Cl.
*G03B 21/16*    (2006.01)
*H05K 7/20*    (2006.01)

(52) U.S. Cl.
CPC ......... *G03B 21/16* (2013.01); *H05K 7/20136* (2013.01)

(58) Field of Classification Search
CPC ...... G03B 21/16; H05K 7/20136; H05K 7/20; G06F 1/3287; G06F 1/3212; G06F 1/3278; G06F 1/266; G06F 1/3215
See application file for complete search history.

(56) References Cited

U.S. PATENT DOCUMENTS

| | | | | |
|---|---|---|---|---|
| 5,579,524 | A * | 11/1996 | Kikinis | G06F 1/26 307/65 |
| 6,216,235 | B1 * | 4/2001 | Thomas | G06F 1/206 713/323 |
| 6,654,894 | B2 * | 11/2003 | Kaminski | G06F 1/206 702/132 |
| 7,017,058 | B2 * | 3/2006 | Chen | G06F 1/3203 713/322 |
| 7,117,054 | B2 * | 10/2006 | Frankel | F04D 27/004 700/300 |
| 7,676,302 | B2 * | 3/2010 | Frankel | F04D 27/004 700/304 |
| 7,937,599 | B1 * | 5/2011 | Thomas | G06F 1/324 713/321 |

(Continued)

FOREIGN PATENT DOCUMENTS

| | | | | |
|---|---|---|---|---|
| JP | 2007036661 A | * | 2/2007 | ............. H04N 5/225 |
| JP | 2007041617 A | * | 2/2007 | ............. G03B 21/00 |

(Continued)

OTHER PUBLICATIONS

Epson's All-In-One EF-100BATV/WATV/ Author;Seiko Epson Corp./ Epson Sales Japan Corp.

*Primary Examiner* — Olga V Merkoulova
(74) *Attorney, Agent, or Firm* — Dority & Manning, P.A.

(57) ABSTRACT

A method of controlling a display device includes feeding electrical power to an image supply device coupled to a first terminal configured to feed the electrical power and provided to the display device via the first terminal with a first power feeding amount when the display device is in an operating state, and feeding the electrical power to the image supply device via the first terminal with a second power feeding amount smaller than the first power feeding amount when the display device is in a standby state.

8 Claims, 2 Drawing Sheets

(56) References Cited

U.S. PATENT DOCUMENTS

| | | | | |
|---|---|---|---|---|
| 7,987,376 | B2* | 7/2011 | Inoue | G06F 1/266 |
| | | | | 713/323 |
| 8,230,243 | B2* | 7/2012 | Fujiwara | G06F 1/266 |
| | | | | 713/320 |
| 8,707,068 | B2* | 4/2014 | Saladin | G06F 1/3209 |
| | | | | 713/320 |
| 9,116,678 | B2* | 8/2015 | Zeung | G06F 1/266 |
| 9,829,959 | B2* | 11/2017 | Tsukamoto | G06F 1/266 |
| 10,356,750 | B2* | 7/2019 | Zarifi | H04W 68/02 |
| 2007/0136617 | A1* | 6/2007 | Kanno | G06F 1/3203 |
| | | | | 713/320 |
| 2010/0115296 | A1* | 5/2010 | Inoue | G06F 1/266 |
| | | | | 713/300 |
| 2011/0161694 | A1* | 6/2011 | Fujiwara | G06F 1/3287 |
| | | | | 713/310 |
| 2011/0264942 | A1* | 10/2011 | Tsukamoto | G06F 1/3287 |
| | | | | 713/324 |
| 2012/0272074 | A1* | 10/2012 | Zeung | G06F 1/266 |
| | | | | 713/300 |
| 2012/0290859 | A1* | 11/2012 | Saladin | G06F 1/3209 |
| | | | | 713/310 |
| 2018/0007659 | A1* | 1/2018 | Zarifi | H04W 68/02 |
| 2021/0149465 | A1* | 5/2021 | Hiltner | G06F 1/206 |

FOREIGN PATENT DOCUMENTS

| | | |
|---|---|---|
| JP | 2011-134126 A | 7/2011 |
| JP | 2014-027507 A | 2/2014 |

* cited by examiner

METHOD OF CONTROLLING DISPLAY DEVICE AND DISPLAY DEVICE

The present application is based on, and claims priority from JP Application Serial Number 2022-055315, filed Mar. 30, 2022, the disclosure of which is hereby incorporated by reference herein in its entirety.

BACKGROUND

1. Technical Field

The present disclosure relates to a method of controlling a display device and a display device.

2. Related Art

In JP-A-2011-134126 (Document 1), there is disclosed an information processing device capable of always feeding electrical power to an external device coupled via a USB (Universal Serial Bus) connector.

The information processing device disclosed in Document 1 performs the power feeding to the external device with the same feeding amount when the information processing device itself is in a standby state as when the information processing device is in a power-on state. Therefore, it is unachievable to reduce the power consumption of the information processing device in the standby state.

SUMMARY

A method of controlling a display device according to an aspect of the present disclosure includes feeding electrical power to an image supply device coupled to a first terminal configured to feed the electrical power and provided to the display device via the first terminal with a first power feeding amount when the display device is in an operating state, and feeding the electrical power to the image supply device via the first terminal with a second power feeding amount smaller than the first power feeding amount when the display device is in a standby state.

A display device according to another aspect of the present disclosure includes a first terminal configured to feed electrical power, a power feeding circuit configured to feed the electrical power to an image supply device coupled to the first terminal via the first terminal with a predetermined power feeding amount, and a processor configured to control the power feeding circuit, wherein the processor executes making the power feeding circuit feed the electrical power to the image supply device with a first power feeding amount when the display device is in an operating state, and making the power feeding circuit feed the electrical power to the image supply device with a second power feeding amount smaller than the first power feeding amount when the display device is in a standby state.

DESCRIPTION OF AN EXEMPLARY EMBODIMENT

An embodiment of the present disclosure will hereinafter be described with reference to the drawings.

It should be noted that in each of the drawings described below, the constituents are shown with the scale ratios of respective sizes set differently between the constituents in some cases in order to make each of the constituents eye-friendly.

Figure 1:
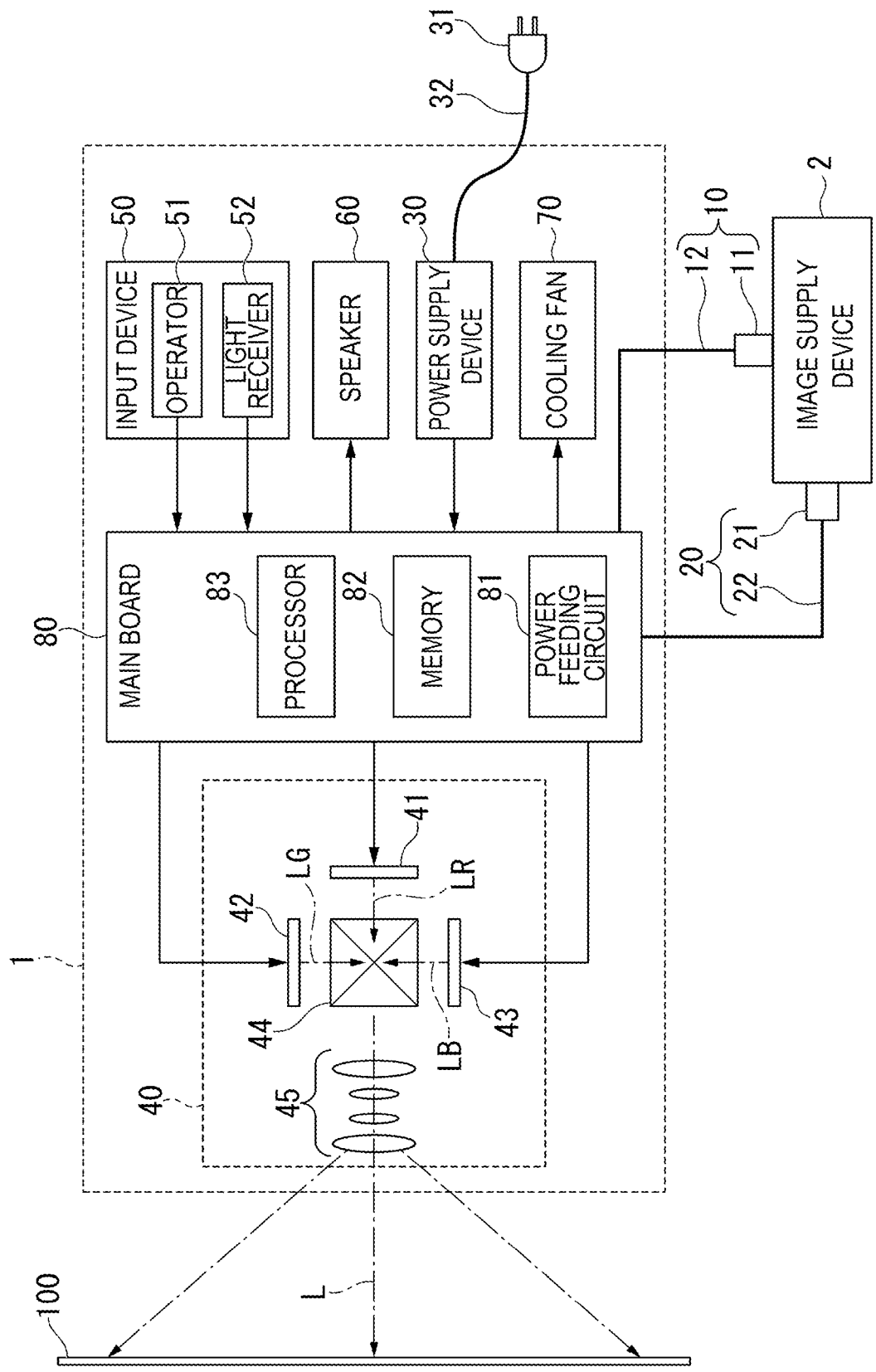
FIG. 1 is a block diagram schematically showing a configuration of a display device according to the embodiment.

FIG. 1 is a block diagram schematically showing a configuration of a display device 1 according to the present embodiment. As shown in FIG. 1, the display device 1 is provided with an external power feeding cable 10, a video signal cable 20, a power supply device 30, an optical device 40, an input device 50, a speaker 60, a cooling fan 70, and a main board 80. As an example, the display device 1 according to the present embodiment is a projector which projects image light L on a projection surface 100 to thereby display an image on the projection surface 100. The projection surface 100 can be a dedicated projector screen, or can also be a wall surface or the like.

The external power feeding cable 10 is a cable used for performing the power feeding from the display device 1 to an external device. The external power feeding cable 10 has a power feeding terminal 11 and a power feeding cable 12. The power feeding terminal 11 is an external coupling terminal compliant with a communication standard capable of feeding the electrical power to the external device. The power feeding terminal 11 corresponds to a first terminal capable of feeding the power. As the communication standard capable of feeding the electrical power to the external device, there can be cited a USB standard such as "USB Type-A" and "USB Type-C," and a standard such as Thunderbolt (a registered trademark). The power feeding terminal 11 is coupled to the main board 80 via the power feeding cable 12. The power feeding cable 12 is a cable for transmitting power supply voltages for the external device and a variety of signals, which are output from the main board 80, to the power feeding terminal 11.

The video signal cable 20 is a cable used for transmitting a video signal, which is supplied from the external device, to the display device 1. The video signal cable 20 has a video input terminal 21 and a signal cable 22. The video input terminal 21 is an external coupling terminal compliant with a video transmission standard such as HDMI (High-Definition Multimedia Interface; a registered trademark) or DVI (Digital Visual Interface). The video input terminal 21 is coupled to the main board 80 via the signal cable 22. The signal cable 22 is a cable for transmitting the video signal, which is supplied from the external device via the video input terminal 21, to the main board 80.

In the present embodiment, as the external device, an image supply device 2 is coupled to the display device 1 via the external power feeding cable 10 and the video signal cable 20. In other words, the power feeding terminal 11 and the video input terminal 21 are each coupled to the image supply device 2. The image supply device 2 is stored in a chassis of the display device 1 in a state of being coupled to the external power feeding cable 10 and the video signal cable 20.

The image supply device 2 starts up when receiving supply of the electrical power from the display device 1 via the external power feeding cable 10. After the image supply device 2 starts up, the image supply device 2 accesses the Internet via a wireless LAN (Local Area Network) compliant with a wireless communication standard such as Wi-Fi (a registered trademark) to supply the video signal, which has been received from a moving picture distribution service or the like on the Internet, to the display device 1 via the video signal cable 20. The image supply device 2 having such a function is called a media streaming terminal in some cases.

The display device 1 generates the image light L based on the video signal supplied from the image supply device 2.

The power supply device 30 is coupled to a power supply plug 31 via a power supply cord 32. The power supply plug 31 is inserted into an outlet (not shown) installed in, for example, user's home. When the power supply plug 31 is inserted into the outlet, the commercial AC voltage of, for example, 100 (V) is supplied to the power supply device 30 via the power supply cord 32. The power supply device 30 converts the commercial AC voltage supplied via the power supply cord 32 into a DC voltage, and then outputs the DC voltage to the main board 80.

The DC voltage output from the power supply device 30 is used as a power supply voltage for making electronic components, circuits, and so on disposed on the main board 80 operate. As described later, on the main board 80, there are disposed at least a power feeding circuit 81, a memory 82, and a processor 83. Further, the DC voltage output from the power supply device 30 is supplied to the optical device 40, the input device 50, the speaker 60, and the cooling fan 70 via the main board 80, and is used as the power supply voltage for making these devices operate.

The optical device 40 is controlled by the processor 83 to thereby generate the image light L representing a color image, and then projects the image light L thus generated toward the projection surface 100. The optical device 40 has a first image generation panel 41, a second image generation panel 42, a third image generation panel 43, a dichroic prism 44, and a projection optical system 45.

The first image generation panel 41 generates red image light LR representing a red image, and then emits the red image light LR to the dichroic prism 44. The first image generation panel 41 has a plurality of pixels arranged in a matrix, and each of the pixels emits red light. By the processor 83 controlling an outgoing light intensity of the red light for each of the pixels, the red image light LR is emitted from the first image generation panel 41.

The second image generation panel 42 generates green image light LG representing a green image, and then emits the green image light LG to the dichroic prism 44. The second image generation panel 42 has a plurality of pixels arranged in a matrix, and each of the pixels emits green light. By the processor 83 controlling an outgoing light intensity of the green light for each of the pixels, the green image light LG is emitted from the second image generation panel 42.

The third image generation panel 43 generates blue image light LB representing a blue image, and then emits the blue image light LB to the dichroic prism 44. The third image generation panel 43 has a plurality of pixels arranged in a matrix, and each of the pixels emits blue light. By the processor 83 controlling an outgoing light intensity of the blue light for each of the pixels, the blue image light LB is emitted from the third image generation panel 43.

For example, each of the image generation panels 41, 42, and 43 is a light-emitting electro-optic device such as an OLED (Organic Light Emitting Diode) panel, or a μSLED (Micro Light Emitting Diode) panel. It should be noted that each of the image generation panels 41, 42, and 43 can be a non-light-emitting electro-optic device such as a liquid crystal panel or a DMD (Digital Micromirror Device). When each of the image generation panels 41, 42, and 43 is the non-light-emitting electro-optic device, light from a light source not shown such as an LED is separated into the red light, the green light, and the blue light. The red light enters the first image generation panel 41. The green light enters the second image generation panel 42. The blue light enters the third image generation panel 43. Further, it is also possible to emits lights of the respective colors in a time-sharing manner using a single-plate image generation panel.

The dichroic prism 44 combines the red image light LR, the green image light LG, and the blue image light LB with each other to thereby generate the image light L representing a color image and then emit the image light L to the projection optical system 45. The projection optical system 45 is constituted by a plurality of optical elements such as a lens, and projects the image light L emitted from the dichroic prism 44 toward the projection surface 100 in an enlarged manner. Although not shown in the drawings, the projection optical system 45 is provided with a mechanism capable of adjusting optical parameters such as a shift amount of a lens, a focus amount of a lens, and a zooming amount of a lens. By those mechanisms being controlled by the processor 83, the optical parameters of the projection optical system 45 are adjusted.

The input device 50 includes an operator 51 and a light receiver 52. The operator 51 is constituted by a plurality of operation keys provided to the display device 1. For example, the operation keys include a power key, a menu invocation key, directional keys, a decision key, and a volume control key. The operation keys can be hardware keys, or can also be software keys displayed on a touch panel. The operator 51 outputs an electric signal, which is generated by each of the operation keys being operated by a user, to the processor 83 of the main board 80 as an operation signal.

The light receiver 52 includes a photoelectric conversion circuit which receives infrared light transmitted from a remote controller (not shown) of the display device 1, and which converts the infrared light into the electric signal. The light receiver 52 outputs the electric signal obtained by the photoelectric conversion on the infrared light to the processor 83 of the main board 80 as a remote operation signal. To the remote controller, there is provided a plurality of operation keys similarly to the operator 51. The remote controller converts the electric signal generated by each of the operation keys provided to the remote controller being operated by the user into the infrared light, and then transmits the infrared light to the display device 1. In other words, the remote operation signal output from the light receiver 52 is substantially the same as the electric signal generated by the user operating each of the operation keys of the remote controller. It should be noted that when the remote controller transmits a radio signal in accordance with a near field communication standard such as Bluetooth (a registered trademark), it is possible to dispose a receiver device for receiving the radio signal instead of the light receiver 52.

The speaker 60 is controlled by the processor 83 to thereby output a sound having a predetermined volume. The cooling fan 70 generates a wind for cooling in the chassis of the display device 1. In the following description, the wind for cooling is referred to as a "cooling wind." The cooling fan 70 is arranged at a position where the cooling wind mainly blows a device generating high heat. For example, the cooling fan 70 is arranged at a position where the cooling wind blows the power supply device 30, the optical device 40, the main board 80, and the image supply device 2 housed in the chassis. The rotational frequency of the cooling fan 70 is controlled by the processor 83.

The main board 80 is a control board provided with electronic components and circuits for controlling an overall operation of the display device 1. The main board 80 has at least the power feeding circuit 81, the memory 82, and the processor 83.

The power feeding circuit 81 is a circuit for controlling the electrical power to be supplied from the main board 80 to the image supply device 2 via the external power feeding cable 10. In other words, the power feeding circuit 81 feeds the electrical power to the image supply device 2 coupled to the power feeding terminal 11 via the power feeding terminal 11 with a predetermined power feeding amount. More specifically, the power feeding circuit 81 feeds the electrical power to the image supply device 2 with the power feeding amount instructed by the processor 83. It should be noted that in the present embodiment, the "power feeding amount" means a value of the electrical power to be supplied to the image supply device 2, and the unit thereof is watt (W).

The memory 82 includes a nonvolatile memory for storing a program and a variety of types of setting data necessary to make the processor 83 execute a variety of types of processing, and a volatile memory to be used as a temporary storage of data when the processor 83 executes a variety of types of processing. For example, the nonvolatile memory is an EEPROM (Electrically Erasable Programmable Read-Only Memory) or a flash memory. The volatile memory is, for example, a RAM (Random Access Memory).

The processor 83 is an arithmetic processing device for controlling the overall operation of the display device 1 in accordance with the program stored in advance in the memory 82. Citing an example, the processor 83 is formed of a single CPU (Central Processing Unit) or a plurality of CPUs. Some or all of the functions of the processor 83 can also be configured by a circuit such as a DSP (Digital Signal Processor), an ASIC (Application Specific Integrated Circuit), a PLD (Programmable Logic Device), or an FPGA (Field Programmable Gate Array). The processor 83 executes a variety of types of processing in parallel or in sequence.

For example, the processor 83 controls the optical device 40 and the speaker 60 based on the operation signal input from the operator 51 and the remote operation signal input from the light receiver 52. Specifically, the processor 83 controls the optical device 40 so that the image light L representing the image based on the video signal which is supplied from the image supply device 2 via the video signal cable 20 is generated, and controls the speaker 60 so that the sound based on the video signal is output.

Further, the processor 83 control the power feeding circuit 81. Although the details will be described later, the processor 83 executes making the power feeding circuit 81 feed the electrical power to the image supply device 2 with a first power feeding amount when its own machine (i.e., the display device 1) is in an operating state, and making the power feeding circuit 81 feed the electrical power to the image supply device 2 with a second power feeding amount smaller than the first power feeding amount when its own machine is in the standby state.

By the processor 83 executing the processing described above in accordance with the program stored in the memory 82, a method of controlling the display device 1 is realized. In other words, the method of controlling the display device 1 according to the present embodiment includes feeding the electrical power to the image supply device 2 coupled to the power feeding terminal 11 capable of performing the power feeding provided to the display device 1 via the power feeding terminal 11 with the first power feeding amount when the display device 1 is in the operating state, and feeding the electrical power to the image supply device 2 via the power feeding terminal 11 with the second power feeding amount smaller than the first power feeding amount when the display device 1 is in the standby state.

Then, an operation of the display device 1 having the configuration described above will be described.

Figure 2:
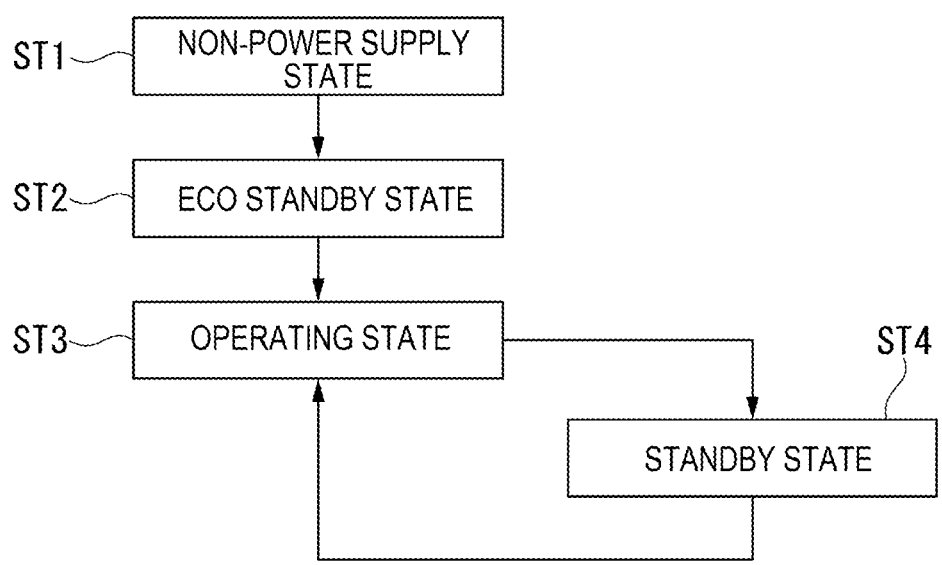
FIG. 2 is a state transition diagram of the display device according to the embodiment.

FIG. 2 is a state transition diagram of the display device 1. As shown in FIG. 2, as states of the display device 1, there are four states, namely a non-power supply state ST1, an ECO standby state ST2, an operating state ST3, and a standby state ST4. The non-power supply state ST1 is a state in which the power supply plug 31 is not inserted in the outlet. Therefore, when the display device 1 is in the non-power supply state ST1, the display device 1 is inoperative. The operation of the display device 1 in the three states, namely the ECO standby state ST2, the operating state ST3, and the standby state ST4, will hereinafter be described.

ECO Standby State ST2

The ECO standby state ST2 means a state in which the power supply plug 31 is inserted in the outlet, but the power key provided to the operator 51 of the display device 1 is not held down. In other words, when the power supply plug 31 is inserted into the outlet, the display device 1 makes the transition from the non-power supply state ST1 to the ECO standby state ST2. When the display device 1 is in the ECO standby state ST2, as an example, the standby power consumption of the display device 1 is limited to no higher than 0.5 (W).

When the display device 1 is in the ECO standby state ST2, the power supply device 30 operates in a first power supply mode of supplying the main board 80 with a minimum amount of the electrical power necessary to make each of the devices incorporated in the display device 1 operate. However, since the power supply voltage is not supplied from the power supply device 30 to the main board 80 unless the power key provided to the operator 51 is held down, the processor 83 does not start up, and the power feeding circuit 81 does not feed the electrical power to the image supply device 2. In other words, when the display device 1 is in the ECO standby state ST2, the power feeding amount from the display device 1 to the image supply device 2 is 0 (W). It should be noted that when the display device 1 is in the ECO standby state ST2, the cooling fan 70 does not operate.

Startup State ST3

When the power key provided to the operator 51 is held down in the state in which the power supply plug 31 is inserted in the outlet, the display device 1 makes the transition from the ECO standby state ST2 to the operating state ST3. Since the power supply voltage is supplied from the power supply device 30 to the main board 80 when the power key provided to the operator 51 is held down, the processor 83 starts up, and the devices including the processor 83 become in an operable state.

As described above, in the present embodiment, the situation in which the display device 1 is in the operating state ST3 means the situation in which the devices including the processor 83 incorporated in the display device 1 are in the operable state. It should be noted that when the display device 1 makes the transition to the operating state ST3, the power supply device 30 operates in a second power supply mode of supplying the main board 80 with a maximum amount of the electrical power necessary to make each of the devices incorporated in the display device 1 operate with a maximum performance.

When the processor 83 receives a transition instruction from the ECO standby state ST2 to the operating state ST3, the processor 83 instructs the power feeding circuit 81 to feed the electrical power to the image supply device 2 with the first power feeding amount. When the processor 83 receives the transition instruction from the ECO standby state ST2 to the operating state ST3 means when the power key provided to the operator 51 is held down when the display device 1 is in the ECO standby state ST2.

The first power feeding amount is the maximum electrical power necessary to make the image supply device 2 operate with the maximum performance. As an example, the first power feeding amount is 10 (W). During a period in which the display device 1 is in the operating state ST3, the power feeding circuit 81 feeds the electrical power to the image supply device 2 with the first power feeding amount instructed by the processor 83.

As described above, when its own machine (i.e., the display device 1) is in the operating state ST3, the processor 83 executes making the power feeding circuit 81 feed the electrical power to the image supply device 2 with the first power feeding amount. By the processor 83 executing the above processing, feeding the electrical power to the image supply device 2 coupled to the power feeding terminal 11, which is provided to the display device 1 and is capable of feeding the electrical power, via the power feeding terminal 11 with the first power feeding amount when the display device 1 is in the operating state ST3 is realized out of the steps included in the method of controlling the display device 1.

The image supply device 2 starts up when receiving supply of the electrical power from the display device 1 via the external power feeding cable 10. After the image supply device 2 starts up, the image supply device 2 accesses the Internet via the wireless LAN to supply the video signal, which has been received from a moving picture distribution service or the like on the Internet, to the display device 1 via the video signal cable 20. The processor 83 controls the optical device 40 so that the image light L representing the image based on the video signal which is supplied from the image supply device 2 is generated, and controls the speaker 60 so that the sound based on the video signal is output.

In a period in which the display device 1 is in the operating state ST3, the cooling fan 70 rotates to thereby generate the cooling wind in the chassis of the display device 1. Thus, the power supply device 30, the optical device 40, the main board 80, and the image supply device 2 housed in the chassis are cooled. The rotational frequency of the cooling fan 70 is set by the processor 83 to a first rotational frequency. In other words, in the method of controlling the display device 1 according to the present embodiment, when the display device 1 is in the operating state ST3, the rotational frequency of the cooling fan 70 provided to the display device 1 is the first rotational frequency. For example, the first rotational frequency is an upper limit value of the rotational frequency of the cooling fan 70.

Standby State ST4

When the power key provided to the operator 51 of the display device 1 or the power key provided to the remote controller is held down when the display device 1 is in the operating state ST3, the display device 1 makes the transition from the operating state ST3 to the standby state ST4. When the power key is held down when the display device 1 is in the operating state ST3, the processor 83 aborts an operation (processing) in execution, saves the data representing a state when aborting the operation in the memory 82, and then turns to a waiting state for a wake-up signal. When the processor 83 becomes in the waiting state for the wake-up signal, the processor 83 stops other functions than a function of detecting the wake-up signal.

As described above, in the present embodiment, the expression that the display device 1 is in the standby state ST4 means that the processor 83 is in the waiting state for the wake-up signal. The fact that the processor 83 is in the waiting state for the wake-up signal can be reworded that the processor 83 is in a sleep state or a suspend state. Therefore, the standby state ST4 can be reworded as the sleep state or the suspend state. It should be noted that even when the display device 1 makes the transition to the standby state ST4, the supply of the power supply voltage from the power supply device 30 to the main board 80 is maintained. It should be noted that when the display device 1 makes the transition to the standby state ST4, the power supply device 30 operates in the first power supply mode.

When the processor 83 receives a transition instruction from the operating state ST3 to the standby state ST4, the processor 83 instructs the power feeding circuit 81 to feed the electrical power to the image supply device 2 with the second power feeding amount smaller than the first power feeding amount. When the processor 83 receives the transition instruction from the operating state ST3 to the standby state ST4 means when the power key is held down when the display device 1 is in the operating state ST3.

The second power feeding amount is the minimum electrical power necessary to make the image supply device 2 operate. As an example, the second power feeding amount is 6 (W). During a period in which the display device 1 is in the standby state ST4, the power feeding circuit 81 feeds the electrical power to the image supply device 2 with the second power feeding amount instructed by the processor 83.

As described above, when its own machine (i.e., the display device 1) is in the standby state ST4, the processor 83 executes making the power feeding circuit 81 feed the electrical power to the image supply device 2 with the second power feeding amount smaller than the first power feeding amount. By the processor 83 executing the above processing, feeding the electrical power to the image supply device 2 via the power feeding terminal 11 with the second power feeding amount smaller than the first power feeding amount when the display device 1 is in the standby state ST4 is realized out of the steps included in the method of controlling the display device 1. It should be noted that it is preferable for the processor 83 to instruct the second power feeding amount to the power feeding circuit 81 in a period from when the power key is held down to when the processor 83 becomes in the waiting state for the wake-up signal.

Further, when the processor 83 receives the transition instruction from the operating state ST3 to the standby state ST4, the processor 83 transmits a first instruction for making the transition of the image supply device 2 from an operating state to a standby state to the image supply device 2 via the external power feeding cable 10. As described above, when the display device 1 is in the operating state ST3, the image supply device 2 is also in the operating state. The situation in which the image supply device 2 is in the operating state means the situation in which devices including a processor incorporated in the image supply device 2 are in an operable state.

As described above, as is obvious from the fact that the processor 83 transmits the first instruction, the method of controlling the display device 1 according to the present embodiment further includes transmitting the first instruction for making the transition of the image supply device 2 from the operating state to the standby state to the image supply device 2 via the power feeding terminal 11 when the display device 1 receives the transition instruction from the operating state ST3 to the standby state ST4.

When the image supply device 2 receives the first instruction from the display device 1 via the external power feeding cable 10, the image supply device 2 makes the transition from the operating state to the standby state. The situation in which the image supply device 2 is in the standby state means the situation in which the processor incorporated in the image supply device 2 is in a waiting state for a wake-up signal. As described above, when the display device 1 makes the transition from the operating state ST3 to the standby state ST4, the image supply device 2 also makes the transition from the operating state to the standby state. It should be noted that it is preferable for the processor 83 to transmit the first instruction to the image supply device 2 in a period from when the power key is held down to when the processor 83 becomes in the waiting state for the wake-up signal.

In the period in which the display device 1 is in the standby state ST4, the rotational frequency of the cooling fan 70 is limited to a second rotational frequency lower than the first rotational frequency. For example, the processor 83 sets 0 (rpm) as the second rotational frequency. In other words, in the period in which the display device 1 is in the standby state ST4, since the cooling fan 70 does not rotate, the cooling wind is not generated in the chassis of the display device 1. As described above, in the method of controlling the display device 1 according to the present embodiment, when the display device 1 is in the standby state ST4, the rotational frequency of the cooling fan 70 provided to the display device 1 is the second rotational frequency lower than the first rotational frequency. It should be noted that it is possible for the second rotational frequency to be a rotational frequency lower than the first rotational frequency and higher than 0 (rpm). It is preferable for the processor 83 to set the rotational frequency of the cooling fan 70 to the second rotational frequency in the period from when the power key is held down to when the processor 83 becomes in the waiting state for the wake-up signal.

Return From Standby State ST4 to Operating State ST3

When the power key provided to the operator 51 of the display device 1 or the power key provided to the remote controller is held down when the display device 1 is in the standby state ST4, the display device 1 makes the transition (returns) from the standby state ST4 to the operating state ST3. When the power key is held down when the display device 1 is in the standby state ST4, the processor 83 detects a signal representing the fact that the power key is held down as the wake-up signal. When the processor 83 detects the wake-up signal, the processor 83 returns from the waiting state to the operable state, and restores the state of the display device 1 to the state when the operation is aborted based on the data representing the state when the operation is aborted saved in the memory 82. It should be noted that when the display device 1 makes the transition from the standby state ST4 to the operating state ST3, the power supply device 30 operates in the second power supply mode.

When the processor 83 receives a transition instruction from the standby state ST4 to the operating state ST3, the processor 83 instructs the power feeding circuit 81 to feed the electrical power to the image supply device 2 with the first power feeding amount. When the processor 83 receives the transition instruction from the standby state ST4 to the operating state ST3 means when the power key is held down when the display device 1 is in the standby state ST4. Thus, the power feeding circuit 81 feeds the electrical power once again to the image supply device 2 with the first power feeding amount instructed by the processor 83.

Further, when the processor 83 receives the transition instruction from the standby state ST4 to the operating state ST3, the processor 83 transmits a second instruction for making the transition of the image supply device 2 from the standby state to the operating state to the image supply device 2 via the external power feeding cable 10. As described above, when the display device 1 is in the standby state ST4, the image supply device 2 is also in the standby state. When the image supply device 2 receives the second instruction from the display device 1 via the external power feeding cable 10, the image supply device 2 makes the transition from the standby state to the operating state.

As described above, as is obvious from the fact that the processor 83 transmits the second instruction, the method of controlling the display device 1 according to the present embodiment further includes transmitting the second instruction for making the transition of the image supply device 2 from the standby state to the operating state to the image supply device 2 via the power feeding terminal 11 when the display device 1 receives the transition instruction from the standby state ST4 to the operating state ST3.

When the image supply device 2 makes the transition from the standby state to the operating state, the image supply device 2 accesses the Internet once again via the wireless LAN to supply the video signal, which has been received from a moving picture distribution service or the like on the Internet, to the display device 1 via the video signal cable 20. The processor 83 controls the optical device 40 so that the image light L representing the image based on the video signal which is supplied from the image supply device 2 is generated, and controls the speaker 60 so that the sound based on the video signal is output. When the display device 1 makes the transition from the standby state ST4 to the operating state ST3, the cooling fan 70 starts to rotate once again with the first rotational frequency.

Advantages of Present Embodiment

As described hereinabove, the method of controlling the display device 1 according to the present embodiment includes feeding the electrical power to the image supply device 2 coupled to the power feeding terminal 11 capable of performing the power feeding provided to the display device 1 via the power feeding terminal 11 with the first power feeding amount when the display device 1 is in the operating state ST3, and feeding the electrical power to the image supply device 2 via the power feeding terminal 11 with the second power feeding amount smaller than the first power feeding amount when the display device 1 is in the standby state ST4.

In such a present embodiment, when the display device 1 is in the operating state ST3, the electrical power is fed from the display device 1 to the image supply device 2 with the first power feeding amount, and when the display device 1 is in the standby state ST4, the electrical power is fed from the display device 1 to the image supply device 2 with the second power feeding amount smaller than the first power feeding amount.

Therefore, according to the present embodiment, it is possible to minimize the standby power consumption of the display device 1 in the standby state ST4. It should be noted that it is preferable for the second power feeding amount to be the minimum electrical power necessary to make the image supply device 2 operate as in the present embodiment. The reason is that when simply setting the second power feeding amount to 0 (W) or a value approximate to 0 (W), there is a possibility that the power supply device 30 breaks down when the supply of unintended high electrical power is requested by the image supply device 2.

In the method of controlling the display device 1 according to the present embodiment, when the display device 1 is in the operating state ST3, the rotational frequency of the cooling fan 70 provided to the display device 1 is the first rotational frequency, and when the display device 1 is in the standby state ST4, the rotational frequency of the cooling fan 70 is the second rotational frequency lower than the first rotational frequency.

In such a present embodiment, when the display device 1 is in the operating state ST3, since the cooling fan 70 rotates with the first rotational frequency which is relatively high, a relatively strong cooling wind occurs in the chassis of the display device 1. As a result, when the display device 1 is in the operating state ST3, it is possible to efficiently cool the power supply device 30, the optical device 40, the main board 80, and the image supply device 2 housed in the chassis.

In contrast, when the display device 1 is in the standby state ST4, since the rotational frequency of the cooling fan 70 is limited to the second rotational frequency which is relatively low, it is possible to prevent an occurrence of a sound noise caused by the rotation of the cooling fan 70, and dust and so on are prevented from being suctioned into the chassis, and thus, it is possible to extend the life of the optical device 40. It should be noted that it is preferable for the second rotational frequency to be 0 (rpm) as in the present embodiment, but the second rotational frequency can be higher than 0 (rpm).

The method of controlling the display device 1 according to the present embodiment further includes transmitting the first instruction for making the transition of the image supply device 2 from the operating state ST3 to the standby state ST4 to the image supply device 2 via the power feeding terminal 11 when the display device 1 receives the transition instruction from the operating state ST3 to the standby state ST4.

According to such a present embodiment, when the display device 1 receives the transition instruction from the operating state ST3 to the standby state ST4, since both of the display device 1 and the image supply device 2 make the transition from the operating state ST3 to the standby state ST4, it is possible to minimize the total standby power consumption of the display device 1 and the image supply device 2.

The method of controlling the display device 1 according to the present embodiment further includes transmitting the second instruction for making the transition of the image supply device 2 from the standby state to the operating state to the image supply device 2 via the power feeding terminal 11 when the display device 1 receives the transition instruction from the standby state ST4 to the operating state ST3.

According to such a present embodiment, when the display device 1 receives the transition instruction from the standby state ST4 to the operating state ST3, since the image supply device 2 in the standby state promptly returns to the operating state together with the display device 1, it is possible to promptly resume the image display by the display device 1.

The display device 1 according to the present embodiment is provided with the power feeding terminal 11 capable of performing the power feeding, the power feeding circuit 81 for feeding the electrical power to the image supply device 2 coupled to the power feeding terminal 11 via the power feeding terminal 11 with the predetermined power feeding amount, and the processor 83 for controlling the power feeding circuit 81, wherein the processor 83 executes making the power feeding circuit 81 feed the electrical power to the image supply device 2 with the first power feeding amount when its own machine is in the operating state St3, and making the power feeding circuit 81 feed the electrical power to the image supply device 2 with the second power feeding amount smaller than the first power feeding amount when its own machine is in the standby state ST4. According to such a present embodiment, it is possible to minimize the standby power consumption of the display device 1 in the standby state ST4.

Although the embodiment of the present disclosure is hereinabove described, the scope of the present disclosure is not limited to the embodiment described above, and a variety of modifications can be made within the scope or the spirit of the present disclosure.

For example, in the embodiment described above, when the processor 83 receives the transition instruction from the standby state ST4 to the operating state ST3, the processor 83 transmits the second instruction for making the transition of the image supply device 2 from the standby state to the operating state to the image supply device 2 via the external power feeding cable 10. The present disclosure is not limited thereto, and it is possible for the display device 1 to receive a third instruction for making the transition of the display device 1 from the standby state ST4 to the operating state ST3 from the image supply device 2 via the external power feeding cable 10 when the image supply device 2 receives the transition instruction from the standby state to the operating state.

In other words, the method of controlling the display device 1 can further include receiving the third instruction for making the transition of the display device 1 from the standby state ST4 to the operating state ST3 from the image supply device 2 via the power feeding terminal 11 when the image supply device 2 receives the transition instruction from the standby state to the operating state.

When the image supply device 2 receives the transition instruction from the standby state to the operating state is, for example, when a power key of a remote controller dedicated to the image supply device 2 is held down. Alternatively, when the image supply device 2 has a voice-recognition function, it is possible for the image supply device 2 to receive a voice which is produced by the user and has a predetermined pattern as the transition instruction.

When the image supply device 2 receives the transition instruction from the standby state to the operating state, the image supply device 2 returns from the standby state to the operating state, and transmits the third instruction to the display device 1 via the external power feeding cable 10. When the processor 83 detects the third instruction received from the image supply device 2 as the wake-up signal, the processor 83 returns from the waiting state to the operable state, and restores the state of the display device 1 to the state when the operation is aborted based on the data representing the state when the operation is aborted saved in the memory 82.

According to the modified example described above, when the image supply device 2 receives the transition instruction from the standby state to the operating state, since the display device 1 in the standby state ST4 promptly returns to the operating state ST3 together with the image supply device 2, it is possible to promptly resume the image display by the display device 1.

Although there is illustrated when the display device 1 is the projector in the embodiment described above, the display device according to the present disclosure is not limited to the projector. For example, the display device according to the present disclosure can be other electronic equipment having an image display function such as a personal computer or a tablet terminal. In general, the electronic equipment such as a personal computer or a tablet terminal is provided with a first terminal capable of feeding the electrical power, a power feeding circuit for feeding the electrical power to an image supply device coupled to the first terminal via the first terminal with a predetermined power feeding amount, and a processor for controlling the power feeding circuit, and can therefore be said to be an aspect of the display device.

A method of controlling a display device according to an aspect of the present disclosure may have the following configuration.

The method of controlling the display device according to the aspect of the present disclosure includes feeding electrical power to an image supply device coupled to a first terminal configured to feed the electrical power and provided to the display device via the first terminal with a first power feeding amount when the display device is in an operating state, and feeding the electrical power to the image supply device via the first terminal with a second power feeding amount smaller than the first power feeding amount when the display device is in a standby state.

In the method of controlling the display device according to the aspect of the present disclosure, a rotational frequency of a cooling fan provided to the display device may be a first rotational frequency when the display device is in the operating state, and the rotational frequency of the cooling fan may be a second rotational frequency lower than the first rotational frequency when the display device is in the standby state.

The method of controlling the display device according to the aspect of the present disclosure may further include transmitting a first instruction for making a transition of the image supply device from the operating state to the standby state to the image supply device via the first terminal when the display device receives a transition instruction from the operating state to the standby state.

The method of controlling the display device according to the aspect of the present disclosure may further include transmitting a second instruction for making a transition of the image supply device from the standby state to the operating state to the image supply device via the first terminal when the display device receives a transition instruction from the standby state to the operating state.

The method of controlling the display device according to the aspect of the present disclosure may further include receiving a third instruction for making a transition of the display device from the standby state to the operating state from the image supply device via the first terminal when the image supply device receives a transition instruction from the standby state to the operating state.

A display device according to an aspect of the present disclosure may have the following configuration.

The display device according to the aspect of the present disclosure includes a first terminal configured to feed electrical power, a power feeding circuit configured to feed the electrical power to an image supply device coupled to the first terminal via the first terminal with a predetermined power feeding amount, and a processor configured to control the power feeding circuit, wherein the processor executes making the power feeding circuit feed the electrical power to the image supply device with a first power feeding amount when the display device is in an operating state, and making the power feeding circuit feed the electrical power to the image supply device with a second power feeding amount smaller than the first power feeding amount when the display device is in a standby state.

What is claimed is:

1. A method of controlling a display device, comprising:
feeding electrical power to an image supply device coupled to a first terminal configured to feed the electrical power and provided to the display device via the first terminal with a first power feeding amount when the display device is in an operating state; and
feeding the electrical power to the image supply device via the first terminal with a second power feeding amount smaller than the first power feeding amount when the display device is in a standby state, wherein
a rotational frequency of a cooling fan provided to the display device is a first rotational frequency when the display device is in the operating state,
the rotational frequency of the cooling fan is a second rotational frequency lower than the first rotational frequency when the display device is in the standby state,
the image supply device is separate from the display device, and
the standby state further includes an ECO standby mode in which power is supplied to the display device but not to the image supply device, and the cooling fan is not operated.

2. The method of controlling the display device according to claim 1, further comprising:
transmitting a first instruction for making a transition of the image supply device from the operating state to the standby state to the image supply device via the first terminal when the display device receives a transition instruction from the operating state to the standby state.

3. The method of controlling the display device according to claim 2, further comprising:
transmitting a second instruction for making a transition of the image supply device from the standby state to the operating state to the image supply device via the first terminal when the display device receives a transition instruction from the standby state to the operating state.

4. The method of controlling the display device according to claim 2, further comprising:
receiving a third instruction for making a transition of the display device from the standby state to the operating state from the image supply device via the first terminal when the image supply device receives a transition instruction from the standby state to the operating state.

5. A display device comprising:
a first terminal configured to feed electrical power;
a power feeding circuit configured to feed the electrical power to an image supply device via the first terminal;
a cooling fan provided to the display device; and
a processor programmed for controlling the power feeding circuit, including
making the power feeding circuit feed the electrical power to the image supply device with a first power feeding amount when the display device is in an operating state, and
making the power feeding circuit feed the electrical power to the image supply device with a second power feeding amount smaller than the first power feeding amount when the display device is in a standby state, wherein
the processor is further programmed for controlling
a rotational frequency of the cooling fan to be a first rotational frequency when the display device is in the operating state, and the rotational frequency of the cooling fan to be a second rotational frequency lower than the first rotational frequency when the display device is in the standby state, the image supply device is separate from the display device, and the standby state further includes an ECO standby mode in which power is supplied to the display device but not to the image supply device, and the cooling fan is not operated.

6. The display device according to claim 5, wherein:

the processor is further programmed for transmitting a first instruction for making a transition of the image supply device from the operating state to the standby state to the image supply device via the first terminal when the display device receives a transition instruction from the operating state to the standby state.

7. The display device according to claim 6, wherein:

the processor is further programmed for transmitting a second instruction for making a transition of the image supply device from the standby state to the operating state to the image supply device via the first terminal when the display device receives a transition instruction from the standby state to the operating state.

8. The display device according to claim 6, wherein:

the processor is further programmed for receiving a third instruction for making a transition of the display device from the standby state to the operating state from the image supply device via the first terminal when the image supply device receives a transition instruction from the standby state to the operating state.

* * * * *